United States Patent
Kim

(10) Patent No.: US 7,384,813 B2
(45) Date of Patent: Jun. 10, 2008

(54) METHOD FOR FABRICATING CMOS IMAGE SENSOR

(75) Inventor: In Su Kim, Choongcheongbukdo (KR)

(73) Assignee: Dongbu Electronics Co., Ltd., Seoul (KR)

( * ) Notice: Subject to any disclaimer, the term of this patent is extended or adjusted under 35 U.S.C. 154(b) by 176 days.

(21) Appl. No.: 11/316,874

(22) Filed: Dec. 27, 2005

(65) Prior Publication Data

US 2006/0141647 A1    Jun. 29, 2006

(30) Foreign Application Priority Data

Dec. 28, 2004   (KR)   .................... 10-2004-0113797

(51) Int. Cl.
*H01L 21/00* (2006.01)
*H01L 21/302* (2006.01)

(52) U.S. Cl. .................. 438/70; 438/27; 438/57; 438/723; 257/292; 257/294; 257/432; 257/E27.133

(58) Field of Classification Search ............... 438/706, 438/27, 723, 724, 70; 257/E31.127, E33.068; H01L 27/148, 27/146
See application file for complete search history.

(56) References Cited

U.S. PATENT DOCUMENTS

2002/0108929 A1* 8/2002 Ho et al. .................. 216/58
2005/0139832 A1* 6/2005 Jeon .......................... 257/69
2006/0097297 A1* 5/2006 Lee ........................... 257/292
2006/0103941 A1* 5/2006 Yamaguchi et al. ........ 359/619

FOREIGN PATENT DOCUMENTS

| KR | 2001061341 A | * | 7/2001 |
| KR | 2003001071 A | * | 1/2003 |
| KR | 2003037850 A | * | 5/2003 |

* cited by examiner

*Primary Examiner*—Hsien Ming Lee
*Assistant Examiner*—Shaka Scarlett
(74) *Attorney, Agent, or Firm*—McKenna Long & Aldridge LLP

(57) ABSTRACT

A method for fabricating a CMOS image sensor forms silicon nitride (SiN) layer on a pad. Microlenses, having a minimum height and footprint according to a desired packing density of the lenses, are fabricated of an oxide film and a nitride film deposited on the silicon nitride. Since the lenses have a low height, a refractive index of the lenses may be improved. A sidewall spacer type inner lens may be additionally formed below a main lens curvature to aid in overcoming problems caused by a single-lens structure.

8 Claims, 4 Drawing Sheets

METHOD FOR FABRICATING CMOS IMAGE SENSOR

This application claims the benefit of Korean Patent Application No. 10-2004-0113797, filed on Dec. 28, 2004, which is hereby incorporated by reference for all purposes as if fully set forth herein.

BACKGROUND OF THE INVENTION

1. Field of the Invention

The present invention relates to a method for fabricating a complementary metal-oxide-semiconductor (CMOS) image sensor, and more particularly, to a method for fabricating a microlens of a CMOS image sensor.

2. Discussion of the Related Art

FIG. 1A illustrates a related art method for fabricating a CMOS image sensor. As shown, a metal line 1a is formed on a sublayer 1. Then, an etching process is performed to form a pad opening 1b, in which an aluminum pad 2a is formed. A pad layer 2 is formed on the sublayer 1, a color filter array 3 is formed on the pad layer 2, and a planarization layer 4 is formed on the color filter array 3. Then, a reflow process for the formation of a microlens 6 is performed. The reflow process includes forming and patterning a photoresist 5 on the planarization layer 4 and then reflowing the patterned photoresist 5 to form the structure shown in FIG. 1B. By this process of reflowing the patterned photoresist 5, the microlens 6 obtains its desired structure including the characteristics of the curvature of its upper surface, its overall size, its configuration, etc.

In the related art, the aluminum pad 2a is contaminated during a photolithography process for patterning an aluminum layer. That is, the patterned aluminum is a particle source that generates particles which remain on the pad 2a.

The formation of the color filter array 3 and the microlens 6, including the reflowing of the photoresist 5, are the final steps of a fabrication process of the related art CMOS image sensor. However, a precise shape of the curved surface of the microlens 6 is difficult to obtain. For example, for a smaller microlens, the curved surface requires a smaller radius and a shorter vertical dimension or peak height of the microlens. The structure of a smaller microlens needs to be shallower to enable an increase in packing density, but it has been particularly difficult to form a microlens having such a lower height as required.

SUMMARY OF THE INVENTION

Accordingly, the present invention is directed to a method for fabricating a CMOS image sensor that substantially obviates one or more the problems due to limitations and disadvantages of the related art.

An advantage of the present invention is to provide a method for fabricating a CMOS image sensor having an increased packing density due to a microlens.

Another advantage of the present invention is to provide a method for fabricating a CMOS image sensor in which precise microlenses may be formed.

Additional features and advantages of the invention will be set forth in the description which follows, and in part will be apparent from the description, or may be learned by practice of the invention. The objectives and other advantages of the invention will be realized and attained by the method particularly pointed out in the written description and claims hereof as well as the appended drawings.

To achieve these and other advantages and in accordance with the purpose of the present invention, as embodied and broadly described, there is provided a method for fabricating a CMOS image sensor including forming a metal line pattern; forming a pad film on the metal line pattern; forming a passivation film on the pad film; forming a recess by etching the passivation film using a photoresist mask for forming a microlens having a desired shape; sequentially depositing a high-density plasma oxide film and an $O_3$ tetra-ethyl-ortho-silicate film on the etched passivation film; and etching back the high density plasma oxide film and the $O_3$ tetra-ethyl-ortho-silicate film to form a main lens curvature on a surface of the etched passivation film and a sidewall spacer type lens at inner sidewalls of the recess of the etched passivation film, thereby forming a dual-lens structure.

A method for fabricating a CMOS image sensor is characterized in that silicon nitride (SiN) is formed on a pad and microlenses are fabricated on the silicon nitride to obtain a small size and a low lens height according to a desired high packing density of the lenses. Therefore, since the lenses have a low height and may be formed of an oxide film and a nitride film, a refractive index of the lenses may be improved. A sidewall spacer type inner lens may be additionally formed below a main lens curvature to aid in forming a desired image and to aid in overcoming problems caused by a single-lens structure.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principles of the invention. In the drawings.

DETAILED DESCRIPTION OF THE INVENTION

Reference will now be made in detail to exemplary embodiments of the present invention, examples of which are illustrated in the accompanying drawings. Wherever possible, like reference designations will be used throughout the drawings to refer to the same or similar parts.

Figure 1A:
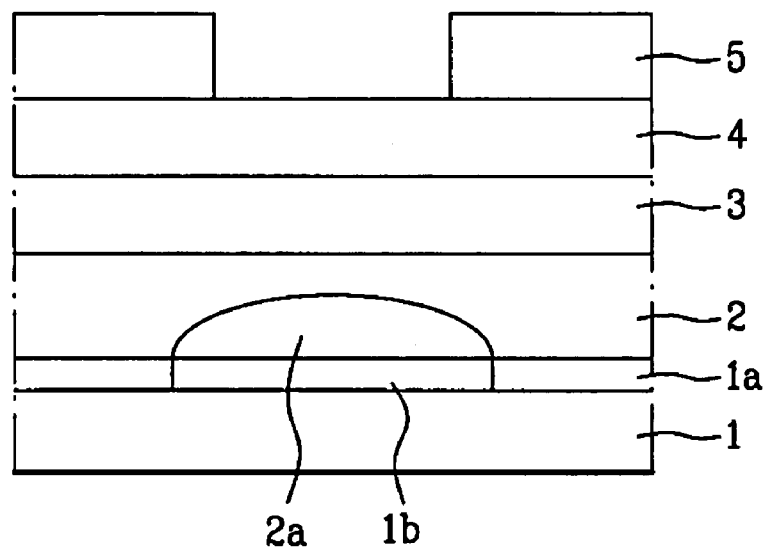
FIGS. 1A and 1B are cross-sectional views illustrating a related art method for fabricating a CMOS image sensor.
Figure 1B:
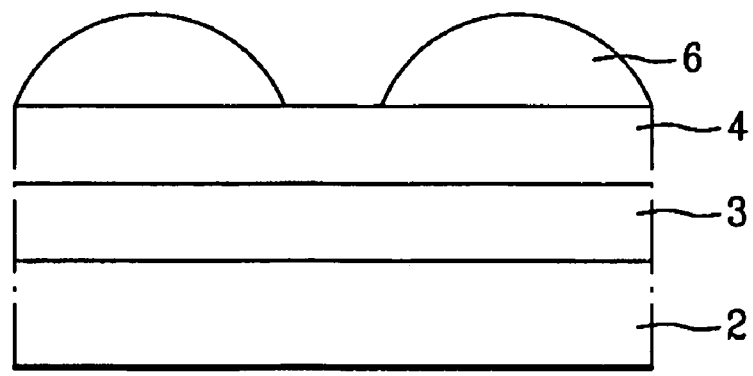
Figure 2A:
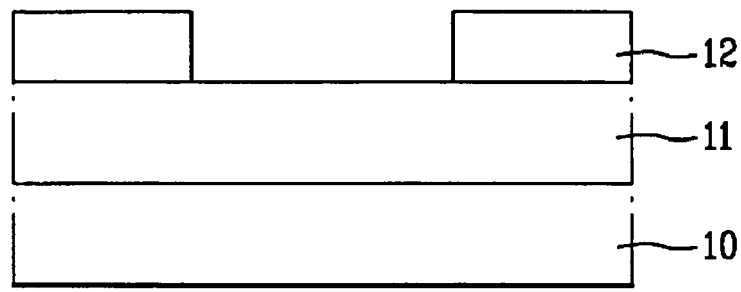
FIGS. 2A-2E are cross-sectional views illustrating a method for fabricating a CMOS image sensor according to the present invention.
Figure 2B:
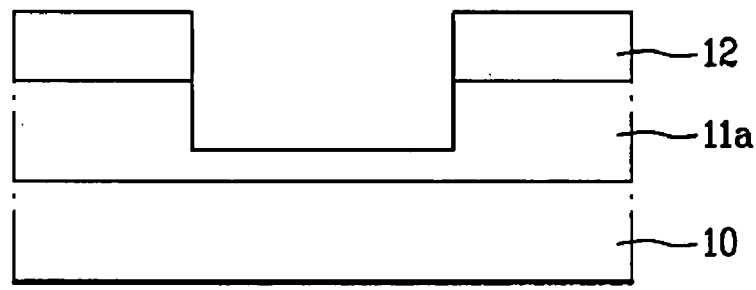

Referring to FIG. 2A, a silicon nitride (SiN) layer 11 is deposited on a pad film 10. A photoresist mask 12 is formed thereon for partially etching an exposed portion of the silicon nitride layer. As shown in FIG. 2B, an exposed portion of the silicon nitride layer is partially etched to form a microlens base 11a, which serves as a passivation layer. A portion of the silicon nitride layer 11 is removed to leave a predetermined thickness of the silicon nitride as an etched recess in an original surface of the silicon nitride layer.

Figure 2C:
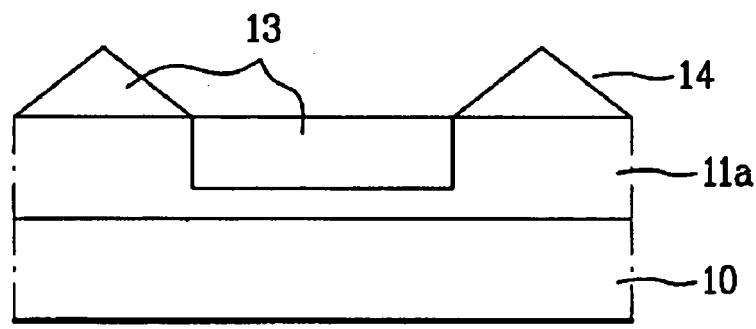

Referring to FIG. 2C, a high-density plasma oxide film is deposited on the microlens base 11a. According to characteristics of a high-density plasma deposition process, a conic microlens structure 13 and 14 of high photoresist is formed on the microlens base 11a.

Figure 2D:
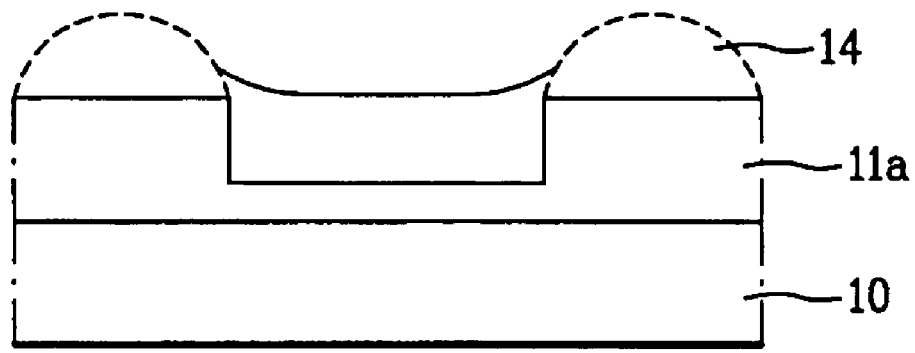

Referring to FIG. 2D, an $O_3$ tetra-ethyl-ortho-silicate deposition process is performed on the exposed surface of the silicon nitride layer, so that the conic microlens structure 13 becomes a microlens curvature 14 having a generally curved upper surface.

Figure 2E:
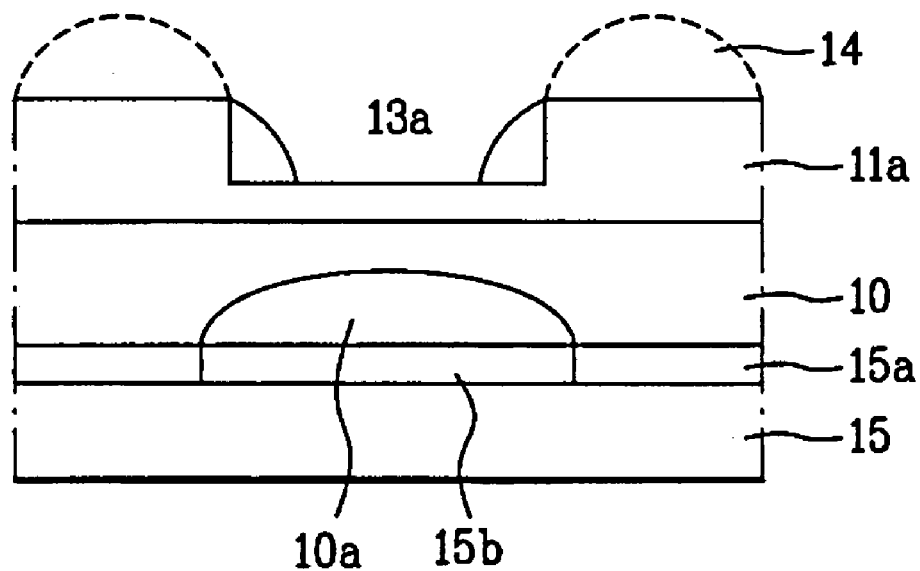

Referring to FIG. 2E, the microlens curvature 14 is etched back to form the final structure of the microlens, namely, a main lens curvature. The conic microlens structure 13 is etched back so that a sidewall spacer type microlens 13a may be additionally formed at the inner sidewalls of the recess of the microlens 11a, thereby forming a dual-lens structure. The etch-back process is performed under the conditions of etchant flow rates of approximately 20-200 sccm (Ar), approximately 5-20 sccm ($C_4F_8$), approximately 30-50 sccm ($CH_3F$), and approximately 20-500 sccm ($O_2$), an top RF power of approximately 200-300 W, a bottom RF power of approximately 50-150 W; and a pressure of approximately 100-200 mTorr.

The above microlens formation is made atop a lower structure. That is, a sublayer 15 is disposed below the pad film 10, and a metal line 15a having an opening 15b is formed on the sublayer 15. An aluminum pad 10a is formed on a portion of a lower surface of the pad film 10 to correspond to the opening 15b.

Figure 3:
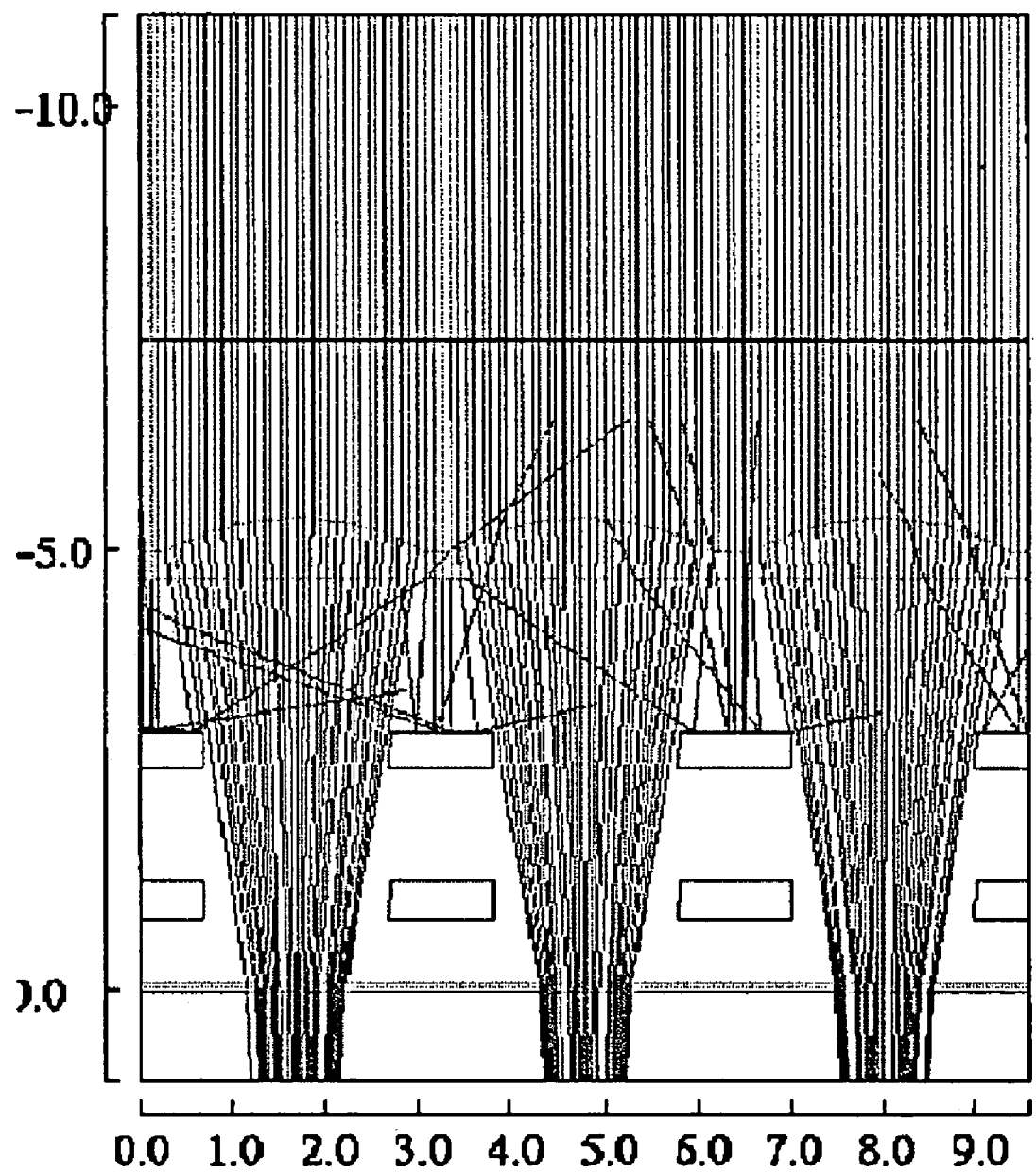
FIG. 3 is a diagram illustrating an avoidance of diffusion of light.

Referring to FIG. 3, an inner microlens is formed on the metal line to focus light incident on the lenses, thereby avoiding diffusion of light. Therefore, the sidewall spacer type microlens 13a corresponding to the inner lens may be formed on any portion of the metal line 15a.

By adopting the method for fabricating a CMOS image sensor according to the present invention, packing density of the lenses may be improved through using the dual-lens structure. It is also possible to reduce a curvature radius of the lenses in the CMOS image sensor, thereby reducing the overall lens height. In addition, since the height of the lenses is lowered, lens precision may be enhanced. Moreover, lens size or footprint may be reduced since the lenses are formed of the oxide film and the nitride film.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a CMOS image sensor, comprising:

forming a metal line pattern;
forming a pad film on the metal line pattern;
forming a passivation film on the pad film;
forming a recess by etching the passivation film using a photoresist mask for forming a microlens having a desired shape;
sequentially depositing a high-density plasma oxide film and an $O_3$ tetra-ethyl-ortho-silicate film on the etched passivation film, wherein depositing the high-density plasma oxide film provides a conic microlens structure of photoresist on a microlens base; and
etching back the high density plasma oxide film and the $O_3$ tetra-ethyl-ortho-silicate film to form a main lens curvature on a surface of the etched passivation film and a sidewall spacer type lens at inner sidewalls of the recess of the etched passivation film, thereby forming a dual-lens structure.

2. The method of claim 1, wherein the passivation film is formed of silicon nitride (SiN).

3. The method of claim 2, wherein after the etching of the passivation film, a predetermined thickness of the silicon nitride as an etched recess in an original surface of the silicon nitride remains.

4. The method of claim 1, wherein the etching back process is performed under conditions of etchant flow rates of approximately 20-200 sccm for Ar, approximately 5-20 sccm for $C_4F_8$, approximately 30-50 sccm for $CH_3F$, and approximately 20-500 for $O_2$, a top RF power of approximately 200-300 W; a bottom RF power of approximately 50-150 W; and a pressure of approximately 100-200 mTorr.

5. The method of claim 1, further comprising:
forming a sublayer below the pad film;
forming a metal line having an opening on the sublayer; and
forming an aluminum pad on a portion of a lower surface of the pad film to correspond to the opening.

6. The method of claim 1, wherein depositing $O_3$ tetra-ethyl-ortho-silicate provides a curved upper surface to the conic microlens structure.

7. The method of claim 6, wherein a dual-lens structure is formed by etching back the conic microlens structure to form a sidewall spacer type microlens.

8. The method of claim 7, wherein the etching back is performed under conditions of etchant flow rates of approximately 20-200 sccm for Ar, approximately 5-20 sccm for $C_4F_8$, approximately 30-50 sccm for $CH_3F$, and approximately 20-500 sccm for $O_2$, a top RF power of approximately 200-300 W, a bottom RF power of approximately 50-150 W, and a pressure of approximately 100-200 mTorr.

* * * * *